United States Patent [19]

Hall

[11] Patent Number: 5,365,100

[45] Date of Patent: Nov. 15, 1994

[54] LOW VOLTAGE COMPOUND MODULATED INTEGRATED TRANSISTOR STRUCTURE

[76] Inventor: John H. Hall, 3169 Payne Ave., San Jose, Calif. 95117

[21] Appl. No.: 114,012

[22] Filed: Aug. 30, 1993

[51] Int. Cl.$^5$ ............ H01L 29/70; H01L 29/80; H01L 29/91

[52] U.S. Cl. .................. 257/370; 257/577; 257/603; 257/481

[58] Field of Search ........... 257/370, 212, 378, 577, 257/578, 588, 481, 603, 370, 212, 378, 578, 588, 481, 603, 476, 477, 577

[56] References Cited

U.S. PATENT DOCUMENTS

| | | | |
|---|---|---|---|
| 4,935,804 | 6/1990 | Ito et al. | 257/476 |
| 5,021,858 | 6/1991 | Hall | 257/370 |

Primary Examiner—Rolf Hille
Assistant Examiner—Wael M. Fahmy
Attorney, Agent, or Firm—Townsend and Townsend Khourie and Crew

[57] ABSTRACT

Disclosed is an integrated transistor structure having increased conductance and operating speed including a complementary insulated gate field-effect transistor pair, each including a source and drain region with a gate contact positioned therebetween, ohmic contacts to the source and drain regions, and a p-n junction contact to each of the drain regions. The gates of the two transistors are interconnected and function as the input terminal, and the two p-n junction contacts are interconnected as the output of the device. The operation of the device is such that the lightly-doped drain regions act as bases of bipolar transistors, with the emitters formed by the p-n junction diodes. Minority carriers injected by the diodes modulate the channel regions, thereby lowering their resistivity and increasing the transconductance of the device without increasing the physical size or the capacitance of the device and thereby improving the speed of the device. Second p-n junction contacts to the drain regions are interconnected, and form auxiliary bipolar transistors in the drain regions to extract charge stored in the main transistor collector to base junction and increasing switching speed in the turn off direction. In turn on, the second p-n junction holds the base away from ground thereby increasing turn on speed.

10 Claims, 1 Drawing Sheet

LOW VOLTAGE COMPOUND MODULATED INTEGRATED TRANSISTOR STRUCTURE

BACKGROUND OF THE INVENTION

This invention relates generally to compound CMOS and bipolar transistor structures, and more particularly the invention relates to compound transistor structures which are operable at lower voltages while maintaining operating speed.

Disclosed in my U.S. Pat. No. 5,021,858 is a CMOS transistor structure which includes regions of opposite polarity within the drain region that act as minority carrier injectors. The drain region forms the base region, the injector region forms the emitter, and the semiconductor body region forms the collector of a bipolar transistor. The resulting structure has a much higher transconductance with no increase in input capacitance, resulting in an increase in operating speed.

In one embodiment of the structure, a CMOS transistor pair is fabricated in the surface of a lightly doped (on the order of $10^{12}$ atoms per cubic centimeter) semiconductor body such as an epitaxial layer formed on a supporting substrate. The drain region of each transistor is lightly doped (on the on the order of $10^{16}$ atoms per cubic centimeter) and a junction diode contact is made thereto adjacent to the drain contact. The resistivity of the drain region is sufficiently high to allow formation of an emitter electrode contact to the drain region by the more heavily doped region. The common gate terminals function as the device input, and the common injecting electrodes function as the device output.

In operation, the drains of the transistors are connected together and form the bases of bipolar transistors with the injecting diodes functioning as emitter followers. The diodes inject minority carriers when the MOS gates are turned on and cause a significant reduction in output resistance. The use of an auxiliary P-N junction injector in conjunction with one transistor pair when operated below 3 volts of a complimentary MOS transistor pair, while retaining the connection between the two drains, overcomes problems of slow switching speed observed in the application of the P-N junction minority carrier injector to a DMOS transistor.

The present invention is directed to a similar compound modulated integrated transistor structure which is operable at lower voltages.

SUMMARY OF THE INVENTION

In accordance with the invention a merged CMOS and bipolar transistor structure includes means interconnecting an ohmic contact and a rectifying junction contact to the drain regions of the MOS transistors. The rectifying contact becomes a second emitter in the drain region of the P channel transistor. By forming the second emitter within the base region adjacent to the first emitter, an auxiliary bipolar transistor is formed. This auxiliary transistor whose collector is the first emitter acts to extract current from the output load, as well as to extract base charge stored in the main transistor collector to base junction, thus increasing its switching speed in the turn off direction. In the turn on direction the second emitter holds the base above ground thereby increasing its turn on speed without adding any additional capacitance which would slow the circuit's speed.

In an alternative embodiment, a single polarity structure is provided by maintaining two rectifying contacts to the drain region of the P channel transistor and having two ohmic contacts to two drain regions of the N channel transistor. The structure is connected between $V_{DD}$ and ground.

A circuit in accordance with the invention can operate at substantially higher speeds and at lower operating voltages (below 2 volts).

The invention and objects and features thereof will be more readily apparent from the following detailed description and appended claims when taken with the drawing.

DETAILED DESCRIPTION OF ILLUSTRATIVE EMBODIMENTS

Figure 1:
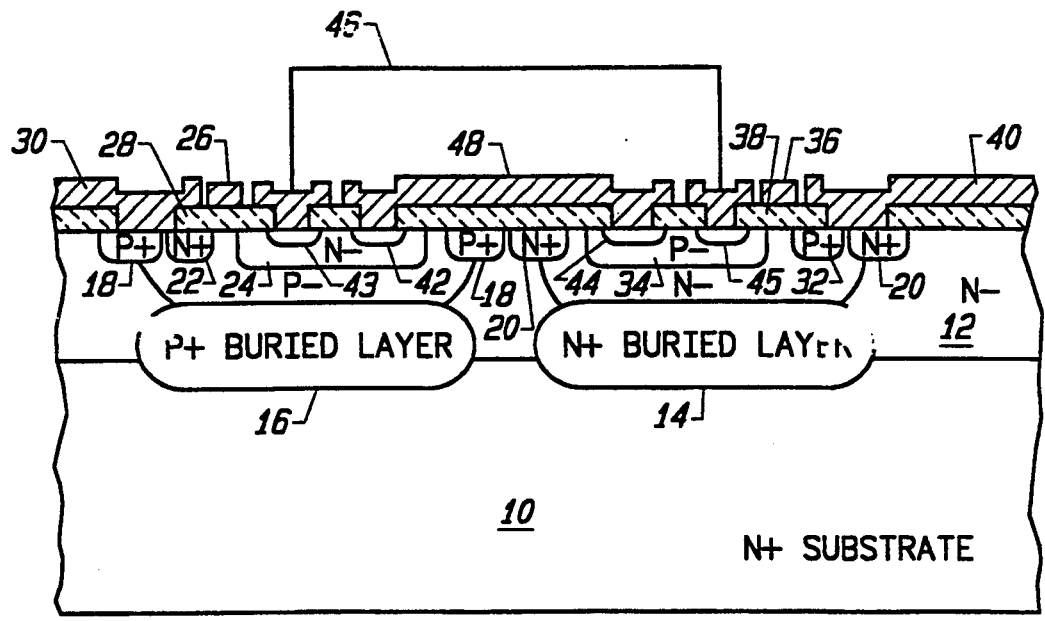
FIG. 1 is a section view of a complementary MOS transistor pair fabricated in accordance with the prior art.

Referring now to the drawing, FIG. 1 is a section view illustrating an integrated transistor structure similar to the structure in U.S. Pat. No. 5,021,858, supra. In this embodiment, an n+ substrate 10 has an n− epitaxial layer 12 formed thereon. The dopant concentration of the epitaxial layer is very light, on the order of $10^{12}$ atoms per cubic centimeter. An n+ buried layer 14 and a p+ buried layer 16 are provided at the interface of the epitaxial layer 12 and substrate 10. Conventionally, the buried layer is formed by highly doped surface regions of the substrate 10 prior to the epitaxial growth of layer 12. The portion of the n− epitaxial layer 12 above the p+ buried layer 16 is converted to p− conductivity by ion implantation. P+ regions 18 are formed at the surface of epitaxial layer 12 and define a device region above the p+ buried layer 16, and n+ regions 20 are formed in the surface of the epitaxial layer 12 of the n+ buried layer region 14 and define a second device region.

An n− channel insulated-gate transistor is formed in the first device region with an n+ source region 22 formed in the surface and a lighter-doped n− region 24 (e.g., $10^{16}$ atoms/cc) spaced from the n− region 22 and defining the drain region. A gate contact 26 is formed over an insulated layer 28 between the source 22 and drain 24. A first metallization 30 interconnects the source 22 to a —V contact.

Similarly, a p-channel insulated-gate transistor is fabricated in the second device region above the $n^{30}$ buried layer 14 with a p+ region 32 forming the source and a lighter-doped p− region 34 (e.g., $10^{16}$ atoms/cc) forming the drain. A gate contact 36 is formed over an insulating layer 38 between the source 32 and drain 34. Metallization 40 connects the source 32 with a +V contact.

In accordance with my U.S. Pat. No. 5,021,858, supra, diffused regions 42 and 44 are made in the n− drain 24 and to the p− drain 34, respectively, of the two transistors. The regions 42 and 44 function as emitters and form junction diodes with the drain regions, and the drain regions function as base regions in complementary bipolar transistors. Metal layer 48 interconnects regions 42 and 44 and functions as the output of the circuit. In accordance with the patent, ohmic contacts 43 and 45 are made to the base regions 24 and 34 which are interconnected by a conductor 46. The buried regions 14 and 16 form the collectors of the bipolar transistors.

Figure 2:
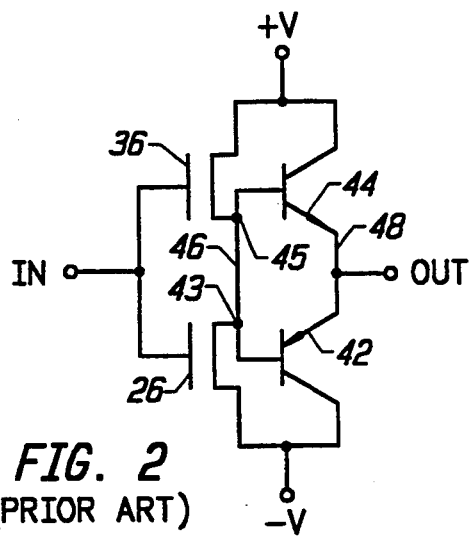
FIG. 2 is a schematic diagram of a prior art integrated transistor structure.

FIG. 2 is an electrical schematic of the structure in accordance with the patent, with the input applied to the common terminal of the gates 26 and 36 of the two field-effect transistors, and the output is taken at the common connection of the emitter contacts 42, 44 of the two bipolar transistors. The diodes inject minority carriers when the MOS gates are turned on and cause a significant reduction in output resistance. The interconnection of the base regions and the low on resistance of the opposite polarity drive transistor extracts any excess stored charge, thereby providing a much higher transconductance with no increase in input capacitance and resulting in an increase in operating speed.

Figure 3:
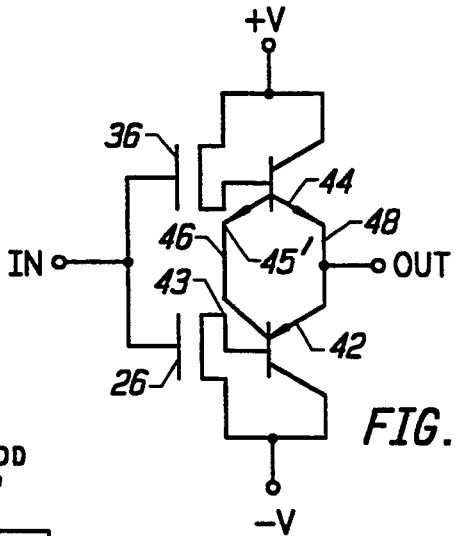
FIG. 3 is a schematic diagram of an integrated transistor structure in accordance with one embodiment of the present invention.

In accordance with a preferred embodiment of the present invention, the ohmic contact 45 to the drain region 34 of the P channel transistor, and to the underlying buried layer, is replaced by rectifying contact 45' as illustrated in the schematic of FIG. 3. All other like elements in FIGS. 1, 2 and 3 have the same reference numerals. The rectifying contact 45' replaces the original ohmic contact and forms a P-N junction with the base region along with emitter contact 44. By forming a second diode within the base region adjacent to the first emitter, an auxiliary bipolar transistor is formed whose collector is the first emitter which acts to extract current from the output load and to extract base charge stored in the main transistor collector to base junction thereby increasing switching speed in the turn off direction. In the turn on direction, the second emitter holds the base above ground thereby increasing its turn on speed without adding any additional capacitance which would slow the circuit speed.

Figure 4:
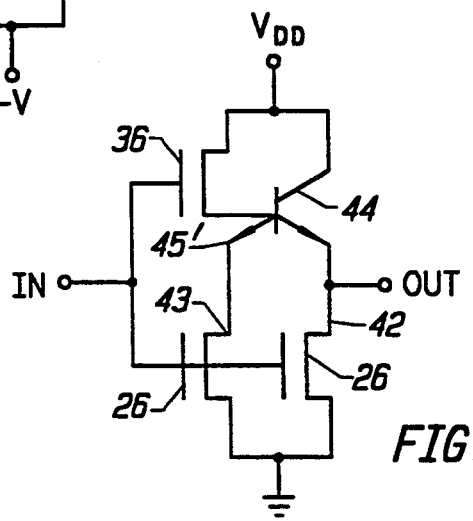
FIG. 4 is a schematic diagram of an integrated circuit transistor structure in accordance with another embodiment of the invention.

FIG. 4 is a schematic of a single polarity structure connected between $V_{DD}$ and ground. The P channel transistor and the two emitter contacts to the drain region are the same as in FIG. 3, with like elements having the same numerals. However, the contacts 42, 43 to the drain region of the N channel transistor are both ohmic.

Circuits in accordance with the invention can operate at substantially higher speeds and at lower operating voltages (below 2 volts). The output of the device of FIG. 3 swings rail to rail (+V, −V) and has a high switching speed due to the base pre-charge available in both polarities. The base of the NPN transistor is precharged to +0.6 V at the beginning of its turn on sequence and the base of the PNP transistor is precharged to $V_{DD}$−0.6 V at the beginning of its turn off sequence.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. An integrated transistor structure comprising
    a semiconductor body having a major surface with a first device region of a first conductivity type and a second device region of a second conductivity type therein,
    a first device formed in said first device region and including a source region and a drain region of said second conductivity type, said source and drain regions being spaced apart by a channel region, a gate contact between said source and drain regions and insulatively spaced from said first device region, an ohmic contact to said source region, a first rectifying contact to said drain region, and a second rectifying contact to said drain region,
    a second device formed in said second device region and including a source region and a drain region of first conductivity type, said source and drain regions being spaced apart by a channel region, a gate contact between said source and drain regions and insulatively spaced from said second device region, an ohmic contact to said source region, a first contact to said drain region, and a second contact to said drain region,
    input connector means interconnecting said gate of said first device and said gate of said second device,
    output connector means interconnecting said second contacts of said first and second devices, and
    means interconnecting said first contacts to said drain regions.

2. The integrated transistor structure as defined by claim 1 wherein said first contact and said second contact of said second device are ohmic contacts.

3. The integrated transistor structure as defined by claim 1 wherein said first contact of said second device is an ohmic contact and said second contact of said second device is a rectifying contact.

4. The integrated transistor structure as defined by claim 1 wherein said semiconductor body comprises a semiconductor substrate and an epitaxial layer formed on a surface of said substrate.

5. The integrated transistor structure as defined by claim 4 wherein said first device further includes a first buried layer of said first conductivity type, and said second device further includes a second buried layer of said second conductivity type.

6. The integrated transistor structure as defined by claim 5 wherein dopant concentration in said drain regions is sufficiently low to enable rectifying contacts thereto.

7. The integrated transistor structure as defined by claim 1 wherein said rectifying contacts to said drain region of said first device comprise doped polycrystalline silicon.

8. A compound modulated integrated transistor structure comprising
    first and second complementary metal oxide silicon (CMOS) transistors each having a source, a drain, a gate, a first contact to said drain, and a second contact to said drain,
    conductive means serially connecting said first contacts,
    input means serially connecting said gates, and
    output means serially connecting said second contacts,
    wherein said first contact and said second contact to said drain of said first metal oxide silicon transistor are rectifying contacts and whereby said drain, said first rectifying contact, and said second rectifying contact form an auxiliary bipolar transistor which increases switching speed.

9. The compound modulated integrated transistor structure as defined by claim 8 wherein said first contact and said second contact to said drain of said second metal oxide silicon transistor are ohmic contacts.

10. The compound modulated integrated transistor structure as defined by claim 8 wherein said first contact to said drain region of said second transistor is ohmic and said second contact to said drain region of said second transistor is rectifying.

* * * * *